(12) United States Patent
Krasnansky

(10) Patent No.: US 6,771,106 B2
(45) Date of Patent: Aug. 3, 2004

(54) PROGRAMMABLE DELAY FOR PROCESSOR CONTROL SIGNALS

(75) Inventor: Keith Krasnansky, Germantown, MD (US)

(73) Assignee: Texas Instruments Incorporated, Dallas, TX (US)

( * ) Notice: Subject to any disclaimer, the term of this patent is extended or adjusted under 35 U.S.C. 154(b) by 177 days.

(21) Appl. No.: 10/124,673

(22) Filed: Apr. 17, 2002

(65) Prior Publication Data

US 2002/0153932 A1 Oct. 24, 2002

Related U.S. Application Data

(60) Provisional application No. 60/284,487, filed on Apr. 18, 2001.

(51) Int. Cl.[7] .............................................. H03H 11/26
(52) U.S. Cl. ...................................... 327/276; 327/263
(58) Field of Search ................................ 327/263, 266, 327/268, 270, 276, 280, 281, 287, 108, 111, 112, 205; 326/82, 83, 84; 365/198

(56) References Cited

U.S. PATENT DOCUMENTS 6,166,971 A * 12/2000 Tamura et al. .............. 365/198
6,178,488 B1   1/2001 Manning ..................... 711/169
6,229,364 B1 *  5/2001 Dortu et al. ................. 327/158
6,377,093 B1 *  4/2002 Lee et al. .................... 327/161

* cited by examiner

Primary Examiner—Linh My Nguyen
(74) Attorney, Agent, or Firm—April M. Mosby; Wade James Brady, III; Frederick J. Telecky, Jr.

(57) ABSTRACT

A programmable delay circuit (100) maximizes processor bandwidth to external peripherals by eliminating wait state addition as the only way for satisfying timing requirements. Circuit (100) includes a programmable delay chain (102) connected to a hysteresis circuit (150). A processor control signal is fed into the programmable delay chain (102) which includes at least one switch (104–116) and at least one resistive element (118–126) connected together. A first feedback circuit (128) connects the output of the programmable delay chain (102) to the input ($IN_2$) of the first embodiment (100) to keep the falling edge of the control signal the same without any significant added delay. The hysteresis circuit (150) which provides a stable signal connects to an output driver (180) for driving the processor control signal.

7 Claims, 2 Drawing Sheets

PROGRAMMABLE DELAY FOR PROCESSOR CONTROL SIGNALS

This application claims priority under 35 USC §119(e)(1) of provisional application No. 60/284,487 filed Apr. 18, 2001.

FIELD OF THE INVENTION

The present invention relates to processors, and, more particularly, to an programmable delay for processor control signals.

BACKGROUND OF THE INVENTION

Conventional computer systems include a processor coupled to a variety of memory devices, including read-only memories (ROMs) which traditionally store instructions for the processor, and a system memory to which the processor may write data and from which the processor may read data. The processor may also communicate with an external cache memory, which is generally a static random access memory (SRAM). The processor also communicates with external peripheral devices such as input devices, output devices and data storage devices using control signals. As shown in FIG. 1, common output driver circuit 10 embedded within the processor circuit includes a n-type and p-type transistor 12 and 14 coupled to provide a push-pull arrangement.

Processors generally operate at relatively high speeds. Processors such as the Pentium IV are currently available that operate at clock speeds of at least 1.5 GHz. However, the remaining components of existing computer systems, with the exception of SRAM cache, are not capable of operating at the speed of the processor. For this reason, the system memory devices, as well as the input devices, output devices, and data storage devices, are not coupled directly to the processor bus. Instead, the system memory devices are generally coupled to the processor bus through a memory controller, bus bridge or similar device, and the input devices, output devices, and data storage devices are coupled to the processor bus through a bus bridge. The memory controller allows the system memory devices to operate at a clock frequency that is substantially lower than the clock frequency of the processor. Similarly, the bus bridge allows the input devices, output devices, and data storage devices to operate at a substantially lower frequency.

Currently, for example, a processor having a 1.5 GHz clock frequency may be mounted on a mother board having a 66 MHz clock frequency for controlling the system memory devices and other components. The time required for the processor, operating, for example, at 1.5 GHz, to read data from or write data to a system memory device operating at, for example, 66 MHz, greatly slows the rate at which the processor is able to accomplish its operations. Thus, much effort has been devoted to increasing the operating speed of system memory devices.

Access to system memory is a frequent operation for the processor. In operation, processors access external memory devices in time periods that are multiples of the processor master input clock. Since these devices do not operate at the clock speed of the mother board, access often requires that wait states be generated to halt the processor until the external device has completed the memory transfer. If external memory accesses take 'n' clock cycles, this is known as a "zero wait state access". If, however, the processor is faster than the external memory device, extra wait states are added per access to accommodate for the external memory's timing requirements. In many high performance designs, situations arise in which an extra wait state must be added simply because a setup-time or hold-time requirement is missed by one or two nanoseconds.

Specifically, the processor operates on a master input clock and all of its output and input signals references this master input clock. When the processor accesses the external memory device, control signals are activated relative to the master input clock signal. If the memory device does not respond with valid sampled data, the processor must retrieve the memory data on the next clock edge. Thus, given a 100 MHz processor, if the processor misses the timing requirements even by one nano-second, it must wait another clock period or 10 nano-seconds, in this example, before it can sample the data again. In systems having a 10 nanosecond SRAM where memory is accessed in two clock cycles, data may be retrieved every 20 nanoseconds but if a timing requirement is missed, the processor must wait another 10 nanoseconds which degrades performance by 30%.

Typically, adding wait states in multiples of processor master input clock periods has been the only way to satisfy timing requirements when peripheral device timing requirements do not exactly match the processor control timing. As a result, the designer of the system is forced to make a significant reduction of the memory access bandwidth in order to meet the timing requirements of the memory device. For example, if a zero wait state access to a memory device takes two processor clock cycles, having to add one wait state due to a missed setup time by one nanosecond reduces the bandwidth up to 50%. This is a huge penalty for high performance systems. Thus, adding wait states to high speed, high performance systems can dramatically reduce the performance of the system.

An approach as disclosed in U.S. Pat. No. 6,178,488, which is incorporated by reference herein, includes the use of a multiplexer that sequentially applies each of the 16-bit data words to a read FIFO buffer. Successive 16-bit data words are clocked through the FIFO buffer by a clock signal generated from an internal clock by a programmable delay circuit. This programmable delay circuit, however, is a synchronous circuit in which processes are delayed by a programmable number of clock periods. Similarly, this separate resultant internal clock generated by the delay circuit has a clock period greater than the master input clock, equal to some multiple of the master input clock. The minimum delay that this circuit can introduce is one clock period of the master input clock. Thus, the problem still remains where there is a need to extend a control signal by an interval that is less than one clock period, instead of the typical method of delaying signals in multiples of the master input clock period.

With the increasing demand for faster processor speeds, maximum processor bandwidth for external peripherals, and maximum processor performance, there is a need for a finer granularity of the control signal timing of the processor such that wait state additions are eliminated as the only means of satisfying timing requirements. Thus, there is a need for a programmable delay driver circuit at the control signal output of a processor that can add a predetermined delay which is less than the master input clock period.

SUMMARY OF THE INVENTION

To address the above-discussed deficiencies of the (processor control signal timing), the present invention teaches programmable delay circuit for control signals that maximize processor bandwidth to external peripherals by eliminating wait state addition as the only means to satisfy timing requirements. A first embodiment may include a programmable delay chain connected to a hysteresis circuit. A processor control signal is fed into the programmable delay chain which includes at least one switch and at least one resistive element connected together. A first feedback circuit connects the output of the programmable delay chain to the input of the first embodiment to keep the falling edge of the control signal the same without any significant added delay. The hysteresis circuit which provides a stable signal connects to an output driver for driving the processor control signal.

Alternatively, other embodiments may include substitutes for the resistive elements and switches.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein.

DETAILED DESCRIPTION OF PREFERRED EMBODIMENTS

Figure 1:
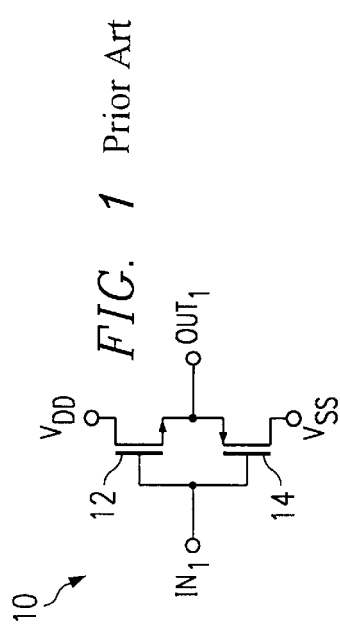
FIG. 1 is a block diagram of an embodiment of a known driver circuit for a processor.
Figure 2:
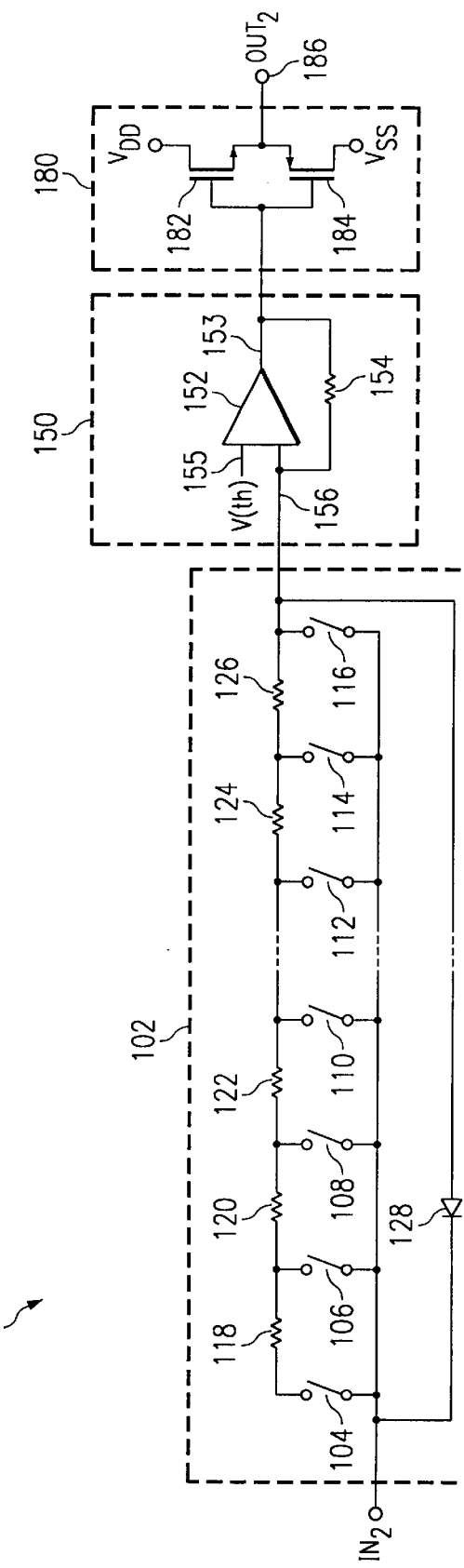
FIG. 2 is a block diagram of an embodiment of a programmable delay driver circuit for a processor in accordance with the present invention.

FIG. 2 is an embodiment, in accordance with the present invention, of the programmable delay driver circuit 100 for a processor that drives control signals. It includes a delay element chain 102, a hysteresis circuit 150 and an output driver circuit 180. The delay element chain 102 couples to the input node $IN_2$ which is connected to a processor bus (not shown) that ultimately couples to either a memory controller (not shown) or directly to a memory device or peripheral to receive a signal such as a Chip Select signal in the instance where data is written to or read from an external peripheral device. Other control signals that have such programmable timing may include read-write, write-enable, and output-enable signals of a typical processor. The memory controller or bus bridge may couple to any peripheral device for the purpose of data transfer. Delay element chain 102 includes switches 104–116 and resistors 118–126 where each resistor-switch pair connect in parallel with the next resistor-switch pair. Switches 104–116 open and close corresponding to a value stored in an internal programmable register (not shown). Only one switch 104–116 need be closed at a time to enable one resistance to be seen at the output of the delay element 102, since closing more than one switch 104–116 would only enable the resistance corresponding to the closed switch closest to the amplifier 152 to be seen at input 156. This circuit assumes and takes advantage of a finite capacitance that naturally exists at the input of the hysteresis circuit. If such naturally occurring capacitance is too small, a capacitive element may be added at this point. A larger resistance provides a greater amount of time between the rising edge of output signal $OUT_2$ and input signal $IN_2$. Delay element chain 102 couples to the hysteresis circuit 150 to keep the rising edge sharp at output node $OUT_2$.

As shown, circuit 150 includes amplifier 152 having differential inputs 155 and 156 and output 153. The first input 155 couples to receive the threshold reference voltage $V_{th}$ and the second input 156 couples to receive the signal from the delay element chain 102. In operation, due to the inherent capacitance of amplifier 152, an RC time constant exists that makes the signal rise slowly when the signal passes voltage $V_{th}$. As a result, output node $OUT_2$ rises sharply. Since a digital signal is desired at output node $OUT_2$ and the input at node 156 is rising slower then normal for a digital signal, the objective is to generate a fast rising edge at output node $OUT_2$. Circuit 150 keeps the signal at the output $OUT_2$ from increasing and decreasing in voltage which would generate noise at output $OUT_2$. Feedback resistor 154 couples the output of amplifier 152 to input 156. Feedback resistor 154 operates to keep the voltage at output node $OUT_2$ stable. As shown, hysteresis circuit 150 couples to the output driver circuit 180. When voltage applied to input node 156 is lower than the threshold voltage $V_{th}$, the voltage at the output 153 of amplifier 152 is zero. Yet the voltage at the input 156 will still be capable of rising when the voltage rises above the threshold voltage $V_{th}$, the output 153 will go high and then the feedback resistor 154 turns into a pull-up resistor which tends to increase the voltage at input 156 decreasing the likelihood of unwanted oscillations occurring at node 153.

Delay element 102 adds delay on the rising edge of the signal. However, the objective is not to generate an equal amount of delay on the falling edge of the signal. Diode 128 keeps the falling edge the same without any significant added delay. Basically, the pulse is widened due to the delay element.

Driver circuit 180 includes two transistors 182 and 184. The gates of transistors 182 and 184 couple to the output from amplifier 152. The drain of transistor 182 couples to voltage supply $V_{DD}$ and the source of transistor 184 couples to voltage supply $V_{SS}$. The source of transistor 182 and the drain of transistor 184 couple to form output 186. The output driver circuit 180 of a control signal which can be a chip select signal or a read/write signal is ultimately driven by hysteresis circuit 150.

Driver 180 amplifies the signal. It is capable of sinking and driving much higher currents. When the signal from output 153 of amplifier 152 is high switch 182 turns on and provides voltage $V_{DD}$ at the output node $OUT_2$. When the signal from output 153 is low, switch 184 turns on and provides voltage $V_{SS}$ at output node $OUT_2$ and switch 182 turns off.

The resistive elements 118–126 can be substituted with gates, buffers, semiconductor devices, capacitive elements. Elements 118–126 may be passive or active. The switches 104–116 may be implemented with transistors through a control register.

The internal control signal is gated through a programmable delay element. An optional hysteresis circuit may be added to sharpen the edge of the delay circuit output. This signal is then fed to the circuit that would typically drive the output. Multiple such circuits may be used to separately control the rising and falling edges of the control signals.

Figure 3:
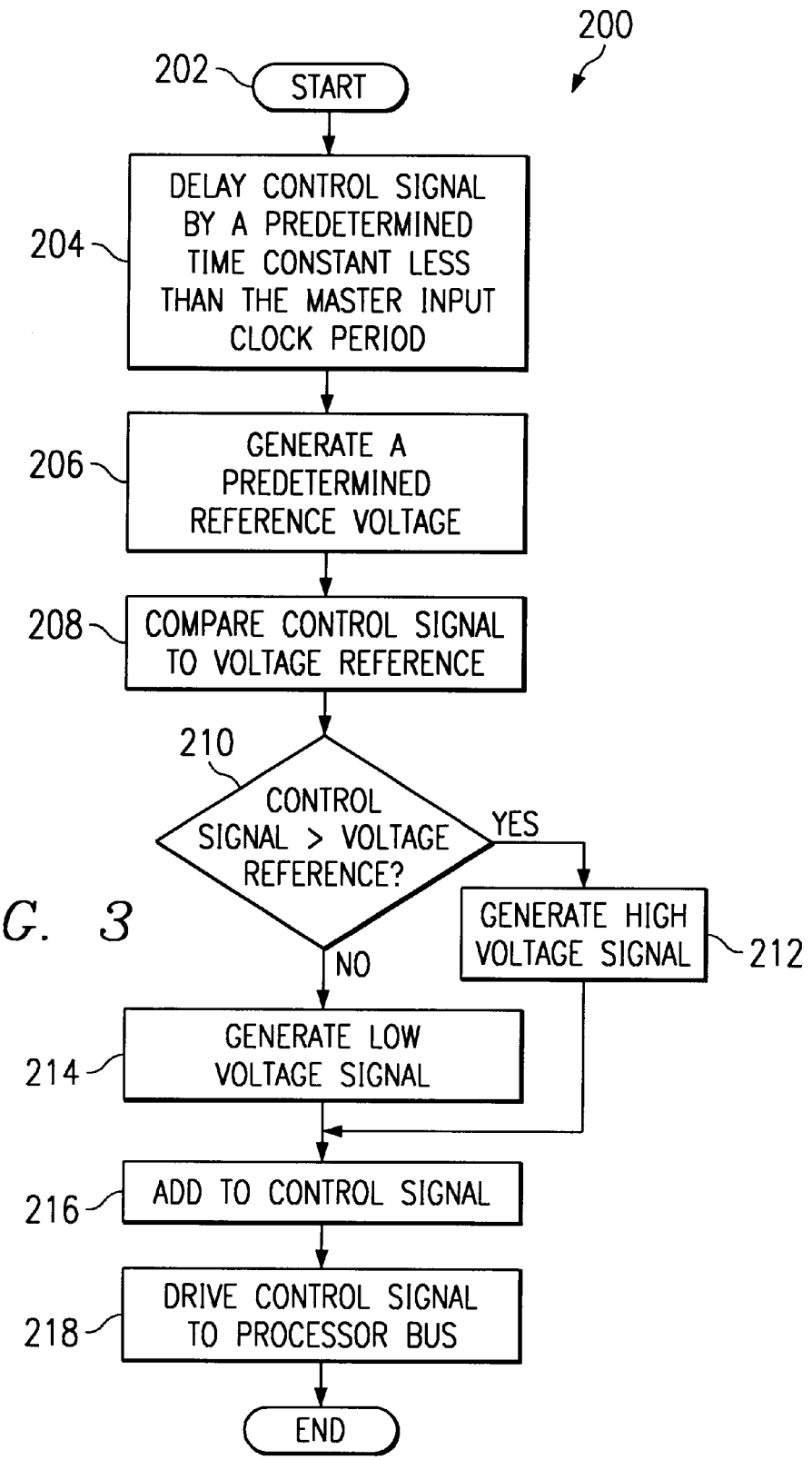
FIG. 3 is a flow chart for the data transfer method in accordance with the present application.

The data transfer method in accordance with the present application is demonstrated using the flowchart displayed in FIG. 3. Specifically, as shown in FIG. 3, A data transfer method for an external peripheral device connected to a processor bus to communicate with a processor having a master input clock in accordance with the present invention may include a step 204 of delaying the control signal having a voltage by a predetermined time constant less than the master input clock period of the processor. A next step 206 may include generating a predetermined reference voltage and, afterwards, comparing the voltage of the control signal to the predetermined reference voltage as shown in step 208. In another step 212, a high voltage signal is generated when the control signal is greater than the predetermined reference voltage. A low voltage signal may be generated when the control signal is lower than the predetermined reference voltage as shown in step 214. In a next step 216, the high and low voltage signal to be added to the control signal may be fed back. Moreover, the control signal may be driven to the processor bus in final step 218.

The reader's attention is directed to all papers and documents which are filed concurrently with this specification and which are open to public inspection with this specification, and the contents of all such papers and documents are incorporated herein by reference.

All the features disclosed in this specification (including any accompany claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

What is claimed is:

1. A programmable delay circuit for an output driver of a processor control signal, having an input and an output, comprising:
    a programmable delay chain comprising
        at least one switch,
        at least one resistive element coupled to the at least one switch, and
        a first feedback circuit comprising a diode, the first feedback circuit coupled between the at least one resistive element and the input;
    a hysteresis circuit coupled to the programmable delay chain to provide a stable signal at the output; and
    an output driver circuit coupled to the hysteresis circuit to amplify the signal of the hysteresis circuit.

2. The programmable delay circuit as recited in claim 1, wherein the at least one resistive element is a resistor.

3. The programmable delay circuit as recited in claim 1, wherein the at least one resistive element is a capacitor.

4. The programmable delay circuit as recited in claim 2, wherein the at least one switch is a MOSFET transistor.

5. The programmable delay circuit as recited in claim 1, wherein the hysteresis circuit comprises:
    an amplifier having a pair of differential inputs and an output, the first differential input coupled to a predetermined reference voltage, the second differential input coupled to the program delay chain; and
    a second feedback circuit coupled between the output of the amplifier and second differential input.

6. The programmable delay circuit as recited in claim 5, wherein the second feedback circuit comprises a resistive element.

7. The programmable delay circuit as recited in claim 1, having a first and a second voltage potential, wherein the output driver circuit comprises a first and a second transistor each having a gate, drain and source, wherein the source of the first transistor coupled to the source of the second transistor, the gate of the first transistor coupled to the gate of the second transistor, the emitter of the first transistor coupled to the first voltage potential and the emitter of the second transistor coupled to the second voltage potential.

* * * * *